(12) United States Patent
Ruelke et al.

(10) Patent No.: US 7,227,916 B2
(45) Date of Patent: Jun. 5, 2007

(54) RECEIVER WITH AUTOMATIC GAIN CONTROL THAT OPERATES WITH MULTIPLE PROTOCOLS AND METHOD THEREOF

(75) Inventors: Charles R. Ruelke, Margate, FL (US); Moshe Ben-Ayun, Shoham (IL); David J. Graham, Gilbert, AZ (US); Mark Rozental, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 792 days.

(21) Appl. No.: 10/649,427

(22) Filed: Aug. 26, 2003

(65) Prior Publication Data
US 2005/0047533 A1    Mar. 3, 2005

(51) Int. Cl.
*H04L 27/08* (2006.01)
(52) U.S. Cl. .................. 375/345; 375/324; 455/232.1; 455/245.1
(58) Field of Classification Search ................ 375/260, 375/261, 268, 269, 271–274, 279, 295, 298, 375/300, 302, 303, 320, 322, 324, 329, 334, 375/340, 344, 345; 455/230, 232.1, 239.1, 455/240.1, 245.1, 102, 110, 115.1, 307; 329/317–319, 329/348–351, 352; 332/108, 119, 120, 151
See application file for complete search history.

(56) References Cited
U.S. PATENT DOCUMENTS

| | | | |
|---|---|---|---|
| 5,483,691 A | 1/1996 | Heck et al. | |
| 5,982,819 A * | 11/1999 | Womack et al. | ............. 375/316 |
| 6,073,848 A | 6/2000 | Geibel | |
| 6,107,878 A | 8/2000 | Black | |
| 6,181,201 B1 | 1/2001 | Black | |
| 6,324,230 B1 | 11/2001 | Graham et al. | |
| 6,480,528 B1 * | 11/2002 | Patel et al. | .................. 375/345 |
| 6,553,084 B1 * | 4/2003 | Maru | .......................... 375/345 |
| 6,965,656 B2 * | 11/2005 | Koizumi | ..................... 375/345 |
| 2002/0160734 A1 | 10/2002 | Li et al. | |
| 2003/0059065 A1 | 3/2003 | Wildhagen et al. | |

* cited by examiner

*Primary Examiner*—Dac V. Ha
(74) *Attorney, Agent, or Firm*—Robert L. King; Michael P. Noonan

(57) ABSTRACT

An automatic gain control (AGC) method and circuit (10) within a receiver uses a digital state machine (26) to implement the AGC function. independent from interaction with a host processor (36) and for multiple modulation protocols without duplicating circuitry. Modulation protocol and parameters for any of various gain responses are stored in a register (29). Multiple states, each corresponding to a predetermined range of RF input signal strength, are stored in the register. Each state contains parameters that determine a gain control signal for controlling a variable gain amplifier (16). The states are independent and may be selectively disabled to create asymmetric responses. Within any state, an adaptable number of iterations may be set to implement a different update rate or step size after a predetermined number of closed loop gain change iterations has not resulted in a transition to a state that represents a desired output gain.

29 Claims, 7 Drawing Sheets

|  | TH2 | | TH1 | | A | | B | | C | |
|---|---|---|---|---|---|---|---|---|---|---|
| AGC STATE | 1 | 2 | 3 | 4 | 5 | ... N |
| RECEIVED SIGNAL STRENGTH | RANGE −2 MUCH LOWER THAN DESIRED (<TH2) | RANGE −1 LOWER THAN DESIRED (<TH1) | RANGE 0 DESIRED RANGE (TH1-A) | RANGE 1 HIGHER THAN DESIRED (>A) | RANGE 2 MUCH HIGHER THAN DESIRED (>B) | ADDITIONAL RANGES, IF ANY |
| AGC ACTION | GAIN UP (DECREASE ATTENUATION) | GAIN UP | NO CHANGE | GAIN DOWN (INCREASE ATTENUATION) | GAIN DOWN | EXTRA STATES POSSIBLE |
| UPDATE RATE | MODERATE | SLOW | NONE | FAST | VERY FAST | TO BE DETERMINED |
| AGC STEP SIZE | 4 x LSB OF DAC 30 | 1 x LSB OF DAC 30 | NONE | 1 x LSB OF DAC 30 | 6 x LSB OF DAC 30 | N x LSB OF DAC 30 |
| ENABLE/DISABLE STATE | DISABLE (TH2_DISABLE ... THX_DISABLE=1) | ENABLE (TH1_DISABLE=0) | ENABLE | ENABLE (CMP_A_DISABLE=0) | ENABLE (CMP_B_DISABLE=0) | SELECTABLE (CMP_N_DISABLE=?) |
| ADAPT INITIATION HOLDOFF TIME (FIG. 8) | 20 ITERATIONS | NONE | NONE | NONE | 4 ITERATIONS | K x LSB |

*FIG. 2*

RECEIVER WITH AUTOMATIC GAIN CONTROL THAT OPERATES WITH MULTIPLE PROTOCOLS AND METHOD THEREOF

FIELD OF THE INVENTION

This invention relates generally to communication receivers, and more specifically, to automatic gain control (AGC) in a receiver.

BACKGROUND OF THE INVENTION

Radio Frequency (RF) receivers typically incorporate Automatic Gain Control (AGC) circuitry to provide proper conditioning of the received RF input power such that the received signal is kept within the usable dynamic range of the receiver. The information embedded in the received signal is transported using one of many different modulation schemes wherein the information may be contained in the frequency or phase of the received signal (e.g. FM, PM, FSK, PSK, etc.), in the amplitude of the received signal (eg. AM), or in both the amplitude and phase of the received signal (eg. QAM). Receiver AGC requirements are driven by several modulation and protocol parameters including, but not limited to, peak-to-average power ratio of the modulation, demodulator dynamic range limitations, analog gain/filtering compression (linearity) responses specific to the particular receiver, protocol driven slotted timing structures, and synchronous versus asynchronous system requirements. Examples of current protocol structures that incorporate distinct AGC system requirements are IS95 (commonly known as CDMA), GSM, iDEN, ETSI EN 300392 known as TErrestrial Trunked Radio (TETRA) and APCO 25. Another standard is the TIA 902 Scalable Advanced Modulation (SAM) standard that is a 700 MHz public domain standard that may be used for public safety applications. In present receivers, AGC system design is generally tailored to specific protocols and modulation strategies.

As has been previously noted, the modulation's peak-to-average ratio greatly influences the selection of the AGC threshold. If the information within the received signal is contained only in the phase component (e.g. FM or PM), the AGC strategy is greatly simplified since the modulated information is not lost even when the receiver is operating in compression. However, as increasing portions of the information are contained in the amplitude component of the received signal, as indicated by increasing peak-to-average ratios of the received signal, the receiver linearity requirements greatly increase thus necessitating increased AGC complexity. With increasing peak-to-average levels, the AGC thresholds are selected so as to keep the receiver operating completely out of compression. Compression is an operating state typically encountered in strong RF input power conditions where an amplifier stage looses its small signal gain characteristic. Compression results in the loss of all or a portion of the amplitude component of the modulated information. Therefore, as the peak-to-average ratio of the modulation increases, it becomes increasingly critical for the AGC to engage sufficient attenuation to prevent the amplifier from operating in a state of compression.

Another important aspect of the AGC system design involves trade-offs between attack time and tracking characteristics as determined by the modulation scheme of the received signal and by protocol specific timing requirements. The AGC tracking rate must be set to avoid distorting the received signal, particularly in the form of undesired amplitude ripple of the received RF carrier induced by the closed loop AGC continuously tracking the signal level. This distortion is particularly detrimental to a received signal containing significant amplitude component within its modulation. To reduce the AM distortion effect, the AGC tracking rate (which is inversely proportional to the closed loop bandwidth of the AGC) must be slowed down such that the AGC cannot respond quickly to amplitude variations in the RF carrier induced by the modulation scheme. Slow AGC tracking rates are desirable for highly linear modulation strategies that incorporate a large amplitude component within the RF carrier, since fast AGC tracking of linear modulation strategies will result in the AGC tracking out the desired amplitude portion of the modulation. However, in a simplified closed loop control system, slowing down the AGC tracking rate has the undesired effect of increasing the AGC attack time. The AGC attack time is the duration required for the AGC to engage the required attenuation to achieve proper demodulation once the receiver has encountered an arbitrary change in RF input power level. Most modern protocol structures require fast AGC attack times. For a basic closed loop feedback system, the fast AGC attack time requirement is in direct conflict with the requirement to minimize AGC induced amplitude distortion of the desired signal. Therefore, there exists a paradox in receiver systems, where particular protocols may require fast AGC attack times necessitating high AGC tracking rates, while the highly linear modulation strategy incorporated into the same protocol may require slow AGC tracking rates that would degrade attack times. Previous receivers have attempted to resolve this paradox by focusing on specific protocols and modulation strategies without regard to readily adapting the system to accommodate multiple protocols and modulation types. It is advantageous for receivers to be readily adaptable to accommodate the numerous modulation strategies and receiver protocols that exist today.

AGC strategies are further complicated by protocol requirements necessitating AGC response to both synchronous and asynchronous signals. Some of these modulation strategies have specific timing requirements where the desired data is contained within specific slots of time for a given duration. Such strategies are synchronous, and are known as Time Division Multiple Access (TDMA) protocols. The same protocol can define another mode which is asynchronous, allowing direct radio-to-radio operation. For example, the TETRA protocol defines a TDMA Trunked Mode of Operation (TMO) and a radio-to-radio mode of operation known as Direct Mode Operation (DMO). In the DMO mode, the receiver is required to receive a discontinuous TDMA signal from another radio. Thus, the receiver AGC settling time should be extremely fast. For multinational wireless communication companies, it is a competitive advantage to define common platforms that are able to meet these diverse protocol timing and modulation linearity requirements. Therefore, the AGC operation must vary significantly for each of these standards, and the receiver hardware must be adapted for all targeted standards, protocols and modulation techniques. Existing systems that are targeted to multiple standards incur significantly increased costs and/or performance degradation due to increased hardware complexity and/or increased system resource demands (i.e. increased host processing resulting in increased power consumption and increased latency in servicing user specific applications).

BRIEF DESCRIPTION OF THE DRAWINGS

The present invention is illustrated by way of example and is not limited by the accompanying figures, in which like references indicate similar elements.

FIG. 2 illustrates in tabular form various state conditions associated with a digital controller of the automatic gain control circuit of FIG. 1;

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
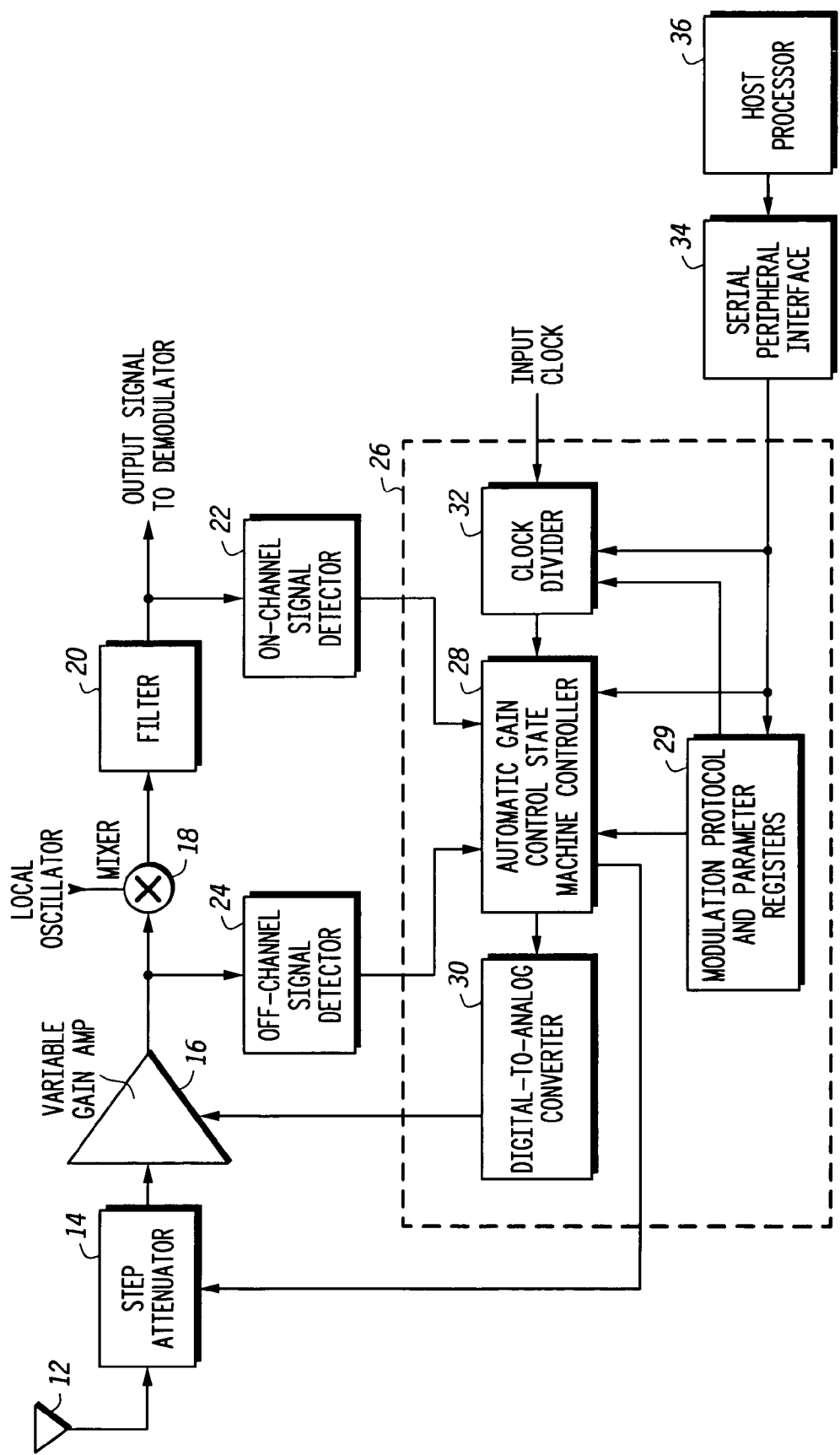
FIG. 1 illustrates in block diagram form a portion of a receiver having an automatic gain control circuit in accordance with the present invention.

Illustrated in FIG. 1 is a receiver 10 with automatic gain control for operating with multiple modulation protocols and which interfaces with a host processor 36 through a serial peripheral interface (SPI) 34. For convenience of illustration and emphasis on automatic gain control, all the circuitry associated with a receiver is not illustrated. The receiver 10 has an antenna 12 connected to an input of a step attenuator 14. Step attenuator 14 has an output connected to an input of a variable gain amplifier 16. An output of the variable gain amplifier 16 is connected to a first input of a mixer 18. A second input of mixer 18 is connected to a Local Oscillator (LO) signal. An output of mixer 18 is connected to an input of a filter 20. An output of the filter 20 is connected to an input of an on-channel signal detector 22 and provides an output signal to be connected to a demodulator (not shown). An output of the variable gain amplifier 16 is connected to an input of an off-channel signal detector 24. An output of on-channel signal detector 22 is connected to a first input of an automatic gain control state machine controller 28. An output of off-channel signal detector 24 is connected to a second input of the automatic gain control state machine controller 28. Automatic gain control state machine controller 28 is made up of conventional logic circuitry for implementing the various circuit states and functions described herein. An output of the automatic gain control state machine controller 28 is connected to an input of a digital-to-analog converter 30, also known as a DAC. An output of the digital-to-analog converter 30 is connected to a control input of the variable gain amplifier 16. A second output of the automatic gain control state machine controller 28 is connected to a control input of the step attenuator 14. A clock divider 32 has an input for receiving an input clock of predetermined frequency. An output of clock divider 32 is connected to a clock input of the automatic gain control state machine controller 28. A storage device implemented as a conventional register is identified as the modulation and protocol and parameter registers 29. The modulation and protocol and parameter registers 29 have outputs respectively connected to a third input of the automatic gain control state machine controller 28 and to a first control input of the clock divider 32. The serial peripheral interface 34 has an input connected to an output of the host processor 36 and an output connected to a second control input of the clock divider 32, to an input of the modulation protocol and parameter registers 29 and to a fourth input of the automatic gain control state machine controller 28. In combination, the clock divider 32, the automatic gain control state machine controller 28, the digital-to-analog converter 30 and the modulation protocol and parameter registers 29 form a state machine 26.

In operation, a radio frequency (RF) signal is received and attenuated sufficiently by either the step attenuator 14 under control of the automatic gain control state machine controller 28 or the variable gain amplifier 16 depending upon the input power level of the received signal. It should be understood that step attenuator 14 is an optional circuit component and step in the method of gain control disclosed herein. The variable gain amplifier 16 is a low noise amplifier that functions to amplify the received RF signal information content without proportionately amplifying the noise content therein. Mixer 18 functions to translate the RF input signal to an intermediate frequency (IF) signal which is then filtered by filter 20 that may be implemented as a bandpass or a low pass filter. This frequency translation requires the application of local oscillator signal to mixer 18 with the Local Oscillator frequency having the mathematical relationship to the RF input carrier that produces the desired intermediate frequency. The filter 20 provides narrow band selectivity so as to attenuate signals that are not the desired RF input signal. The level of attenuation is dependent on the filter characteristics and the magnitude of the offset between the desired RF input signal and any other signal that may be attenuated by the filter 20. The output of filter 20 is connected to a demodulator (not shown) and to the on-channel signal detector 22. The on-channel signal detector 22 produces a digital word that indicates the level of the signal swing at the output of filter 20. The on-channel signal detector 22 may be implemented by a variety of different conventional circuits. By way of illustration only, on-channel signal detector 22 may be implemented with a signal detector (not shown) connected in series with an integrator (not shown) that is connected to an analog-to-digital (A/D) converter (not shown) for providing a digital output to state machine 26. The signal detector may be implemented with any of conventional detectors such as a sum of squares detector, a full wave rectifier detector, a root sum squares detector or a peak detector. The signal detector provides a signal that represents the signal strength, which is then integrated prior to being converted to a digital representation. This digital word at the output of on-channel signal detector 22 is processed by the automatic gain control state machine controller 28 to determine the AGC attenuation response. In addition, the output of variable gain amplifier 16 is connected to off-channel signal detector 24. The off-channel signal detector 24 produces a digital word indicating the signal strength of the unfiltered signal level at the output of the variable gain amplifier 16. This may include input power levels of signals that are not the desired RF carrier, and may exhibit significantly increased power levels. By way of illustration only, off-channel signal detector 24 may be implemented with an RF detector (not shown) connected in series with an integrator (not shown) that is connected to an analog-to-digital (A/D) converter (not shown) for providing a second digital output to state machine 26 that represents a D.C. signal that is proportional to RF signal output of variable gain amplifier 16. The RF detector (not shown) provides an output from the RF signal that is similar to a full wave rectified signal meaning that the RF detector output is a D.C. signal having an A.C. component. The integrator (not shown) functions as a low pass filter. Therefore, the off-channel signal detector 24 provides a digitized quantity of a D.C. signal that is proportional to the RF signal output of variable gain amplifier 16. The output of the off-channel signal detector 24 is also processed by the automatic gain control state machine controller 28 in conjunction with the output of the on-channel signal detector 22. Other structural implementations of the on-channel signal detector 22 and off-channel signal detector 24 may be used. For example, the internal structures of the on-channel signal detector 22 and the off-channel signal detectors 24 may be similar and may include, but is not limited to, other circuitry for rectifying the RF signals to produce a proportional D.C. voltage and formatting the D.C. voltage into a digital word that indicates the magnitude of the D.C. voltage. State machine 26 functions as a digital controller to control the receiver gain by controlling variable gain amplifier 16 and implements this function without requiring monitoring by the host processor 36, thereby allowing the host processor 36 to perform other functions while the AGC function is occurring. The automatic gain control state machine controller 28 processes the input digital words from the on-channel signal detector 22 and the off-channel signal detector 24 based on the control parameters stored in modulation protocol and parameter registers 29 or programmed by the serial peripheral interface 34 at a speed controlled by the frequency of the clock signal provided-by clock divider 32. The conditions indicated by the off-channel signal detector 24 and the on-channel signal detector 22 in conjunction with the parameters in the modulation protocol and parameter registers 29 determine digital-to-analog converter 30 output stimulus that controls the variable gain amplifier 16 attenuation and the step attenuator 14 state (i.e. whether step attenuator 14 is engaged or disengaged).

The parameters in the modulation protocol and parameter registers 29 are provided from the host processor 36 prior to the receive operation discussed herein. The host processor 36 uses the serial peripheral interface 34 to set control information corresponding to a desired attenuation control response. The host processor 36 performs this function once during an initialization and is then free from servicing on-going internal maintenance functions and user-specific application requirements. It should be noted that this feature is a significant savings in system resources as the host processor 36 is not required to service the AGC function.

Illustrated in FIG. 2 is a table that represents a multiple state partitioning of the overall AGC response embedded into the automatic gain control state machine controller 28 of FIG. 1. FIG. 2 illustrates five states in detail with up to N states possible, where N is an integer. Each state has an independent AGC action responding to specific input signal levels as determined by the digital word indicated from the on-channel signal detector 22 and the off-channel signal detector 24. It is further noted that the specific AGC action within each state is determined by the automatic gain control state machine controller 28 by setting the update rate and the AGC step size at the output of digital-to-analog converter 30. As has been previously noted, the digital-to-analog converter 30 controls the attenuation of variable gain amplifier 16 which correspondingly adjusts the output of on-channel signal detector 22 and off-channel signal detector 24 creating a closed loop AGC system. The mechanism for controlling the overall AGC loop response is determined by adjusting the update rate and the step sizes for each given state within the automatic gain control state machine controller 28. The step size is the voltage difference between contiguous updates at the digital-to-analog converter 30 output, with the minimum step size being one least significant bit (LSB) of the digital-to-analog converter 30. Higher step sizes are achieved by increasing the digital-to-analog converter 30 output to be multiples of the LSB voltage change. The update rate is the periodicity between contiguous output changes of digital-to-analog converter 30. The update rate is changed by varying the clock divider ratio and/or internal divider structures contained within the automatic gain control state machine controller 28. In addition, FIG. 2 illustrates the ability to enable and disable specific states to further refine the overall AGC response by including or excluding states based on the operational protocol and modulation-type (application) basis. Additionally, FIG. 2 illustrates that a given state can incorporate multiple characteristics as defined by step size and update rate, each characteristic differentiated by a specific count limit that would trigger a transition between characteristics once a given count has been exceeded. The count limit that would trigger transitions within a given state is independent between states and may not be included into every state. The advantage of incorporating count limits for a parameter set in a given state is that it gives the automatic gain control state machine. controller 28 the ability to adapt a response for unknown or unanticipated RF environments such as encountering extremely strong or weak RF signals necessitating significant step size and update rate changes. As an example, AGC state 2 represents a received signal strength that is lower than desired. In other words, the received signal has a strength that is less than threshold TH1 but greater than threshold TH2. Therefore, the desired AGC action is to increase the gain which means to decrease any existing attenuation. Since this state is adjacent the desired state 3, the update rate, rd_1, is made slow. For this state, the AGC step size is one LSB whereas the AGC step size for states further away from desired state 3 is significantly larger in order to quicker reach the desired gain state. For the particular modulation protocol, this state is enabled and enablement is accomplished by making the bit TH1_DISABLE equal to zero. Also, since state 2 is close to desired state 3, there is no adapt initiation hold-off time which will be discussed below in detail in connection with FIG. 8.

Figure 3:
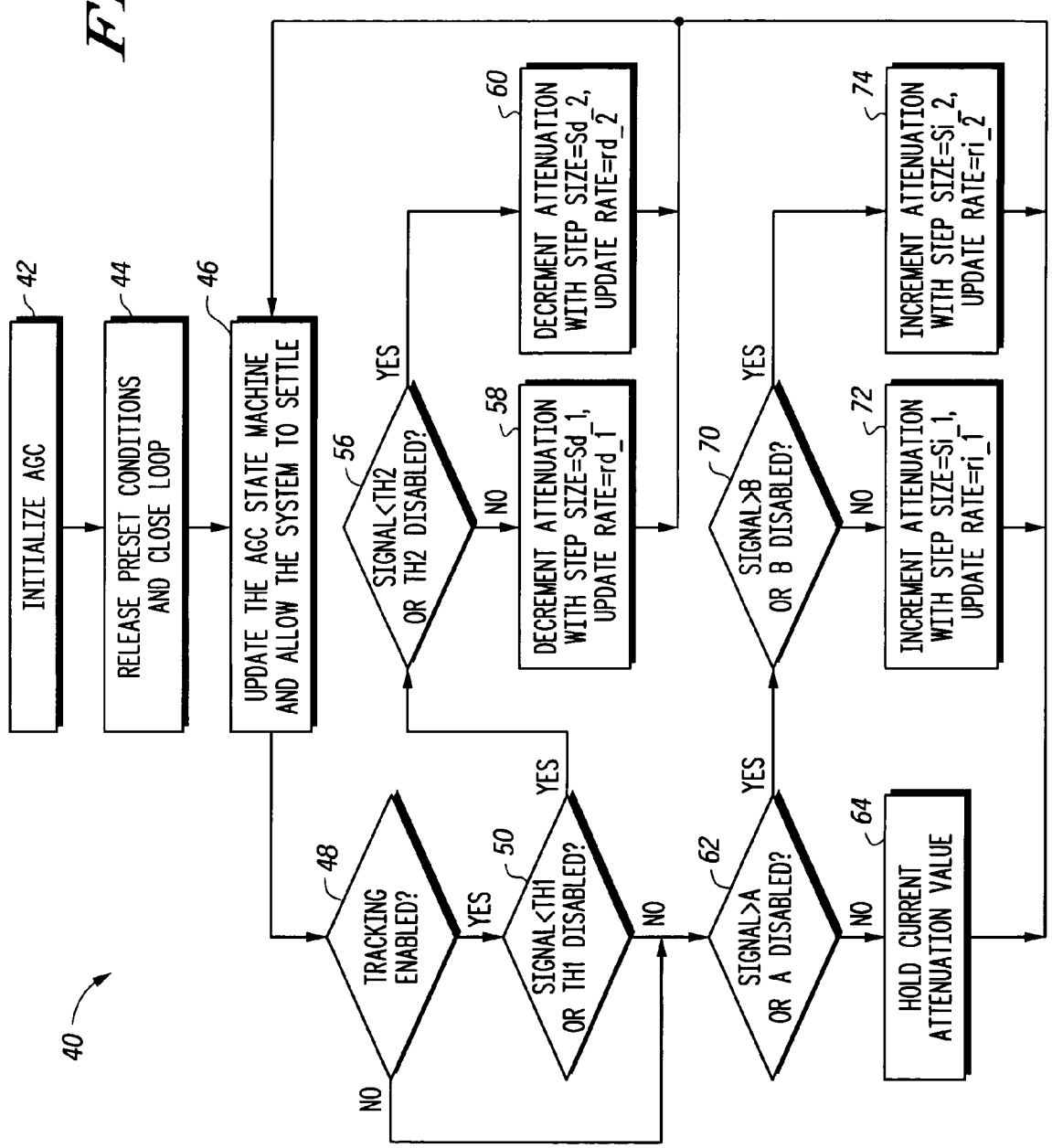
FIG. 3 illustrates a simplified flow chart of a method of automatic gain control in accordance with the present invention.

Illustrated in FIG. 3 is an automatic gain control (AGC) method 40 for use with receiver 10. In a step 42, the AGC is initialized to a predetermined value. The initialization is loading state parameters from the modulation protocol and parameter registers 29 into the automatic gain control state machine controller 28, setting the digital-to-analog converter 30 output to reflect the modulation protocol and parameter registers 29 parameters and providing sufficient time for the variable gain amplifier 16 to reach the corresponding operational condition as set by the control voltage provided by digital-to-analog converter 30. In step 42, the information provided by on-channel signal detector 22 and off-channel signal detector 24 is ignored so that the AGC loop is open. In a step 44, preset conditions are released from fixed control and the loop is closed. This means that the input signals provided by on-channel signal detector 22 and off-channel signal detector 24 are used by the automatic gain control state machine controller 28 to adjust the output of digital-to-analog converter 30 until a steady state closed loop operation is achieved.

In a step 46, the automatic gain control state machine controller 28 is continuously processing the signal indicators in the form of digital words from on-channel signal detector 22 and off-channel signal detector 24 and adjusting any changes in operational states based on the predefined thresholds that were load in previously from the modulation protocol and parameter registers 29. The system is then allowed to settle. A determination is then made in a step 48 as to whether tracking is enabled. The term "tracking" refers to whether the AGC is allowed to increase and decrease gain (i.e. bidirectional) or whether it can only adjust the variable gain amplifier 16 in one direction. If tracking is not enabled, a step 62 is then performed wherein a determination is made as to whether the received signal is greater than threshold A or whether threshold A is disabled. If either condition in step 62 is satisfied, then a step 70 is executed to determine the step size and update rates that will be utilized. If neither parameter in step 70 is satisfied, a step 72 is executed; however, if both parameters in step 70 are satisfied, a step 74 is executed. In step 72 the attenuation is incremented by a step size $Si\_1$ at update rate $ri\_1$, and in step 74 the attenuation is incremented by a size of $Si\_2$ at update rate $ri\_2$. As will be described below, these step sizes and update rates must be carefully chosen to provide a stable AGC loop dynamic. If however, neither condition in step 62 is satisfied, then it is known that the receiver 10 is operating at the proper gain level. Step 64 is implemented wherein all gain parameters are held at the present values to maintain the current attenuation value of variable gain amplifier 16. After completion of any of the steps 64, 72 or 74, a return to step 46 occurs wherein the monitoring of the input signal levels by on-channel signal detector 22 and off-channel signal detector 24 continues.

Assume in step 48 that tracking is enabled and step 50 is executed. A decision is made by the automatic gain control state machine controller 28 whether the received signal has a magnitude that is less than the first threshold, Th1, or whether threshold Th1 is disabled. If either condition in step 50 is satisfied, a step 56 is executed to determine the step size and update rates that will be utilized in increasing gain of the variable gain amplifier 16. If neither parameter in step 56 is satisfied, a step 58 is executed; however, if both parameters in step 56 are satisfied, a step 60 is executed. In step 58 the attenuation is decremented by a step size $Sd\_1$ at update rate $rd\_1$, and in step 60 the attenuation is decremented by a size of $Sd\_2$ at the update rate of $rd\_2$. After the completion of step 58 or step 60, a return to step 46 occurs wherein the monitoring of the input signal levels by on-channel signal detector 22 and off-channel signal detector 24 continues. It can therefore be seen that steps 48, 50, 56, 58 and 60 represent a decrement attenuation branch of the methodology and that steps 62, 64, 70, 72 and 74 represent an increase attenuation branch of the methodology and when both branches are available for use, bidirectional gain adjustments can be implemented.

Figure 4:
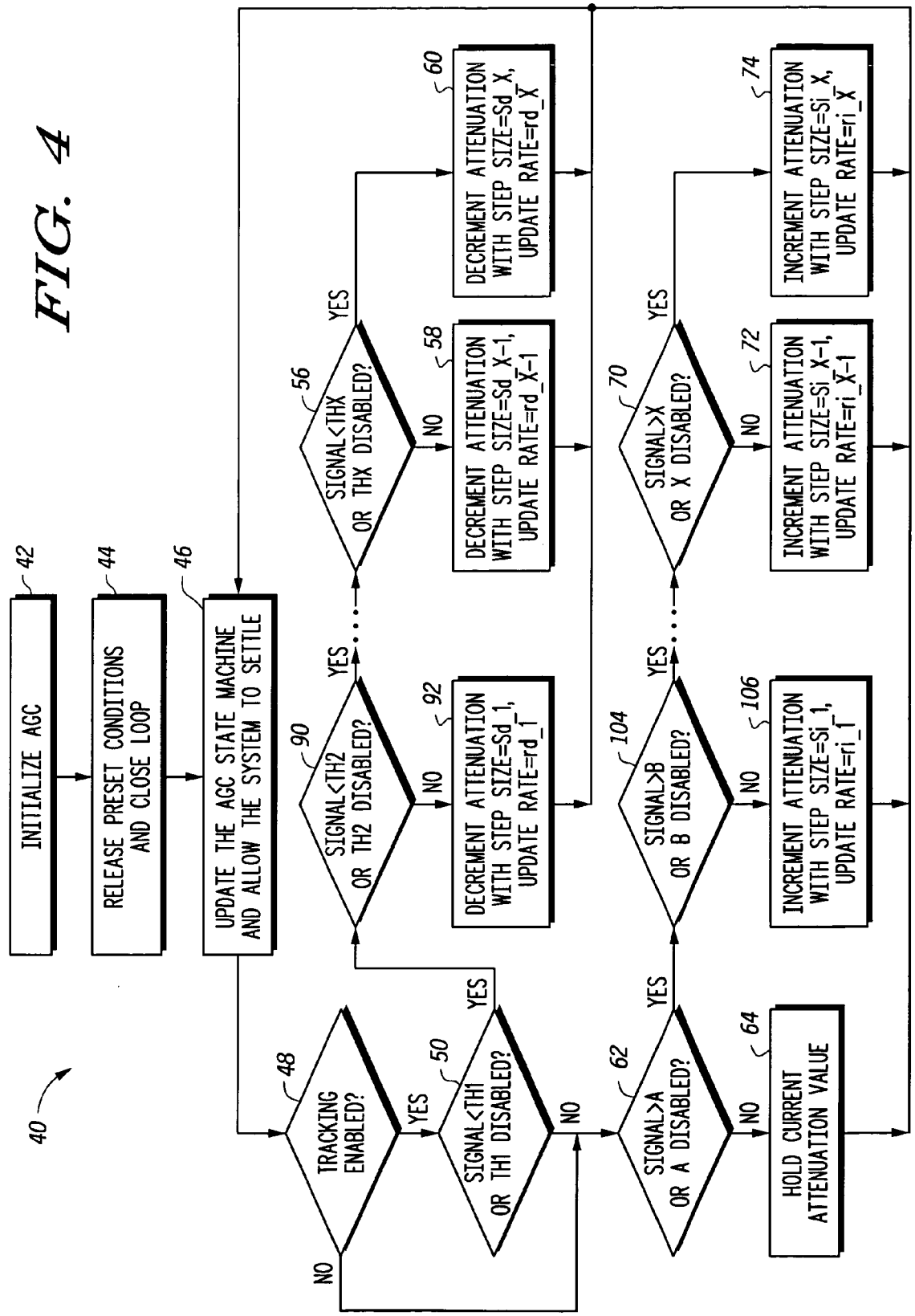
FIG. 4 illustrates a more detailed flow chart of the method of automatic gain control in accordance with the present invention.

Illustrated in FIG. 4 is an expansion of FIG. 3 wherein more than the four states that were provided in FIG. 3 are defined. For convenience of explanation, the same steps are given the same reference numbers. It should be noted that the syntax for the step size and update rate associated with steps 58, 60, 72 and 74 and the signal strength determination steps 58 and 72 differs between FIG. 3 and FIG. 4 since there are additional intervening states in FIG. 4. In other words, the step size and update rate nomenclature used in FIG. 4 is generic wherein the FIG. 3 illustration represents the resulting embodiment for X equals two. Referring to FIG. 4, if either condition associated with step 50 is satisfied, a step 90 is performed. In step 90, if either condition is satisfied, a threshold comparison will be made in subsequent steps (not shown) until such time as a step decision is not satisfied (i.e. until a "No" decision occurs, assuming that step 56 is not encountered). Upon a "No" decision in step 90, a step size and update determination is made in a resultant step 92. If step 90 results in a "Yes" decision, subsequent decision steps are encountered utilizing different threshold settings until such time as a "No" decision is encountered. Once a "No" decision is encountered, a resultant step will define the update rate and step size for that threshold. As the amount of attenuation that variable gain amplifier 16 provides is adjusted, successive thresholds will be encountered within the cascaded structure between the decision steps 90 and 56 as indicated by the dotted lines of FIG. 4 intervening steps 90 and 56. Each decision step will result in a change to the step size and update rate. Thus, the AGC response is dynamically adjusted to create a specific overall response (very fast initial AGC attack times and slow, over damped update rates once the desired attenuation level is achieved). It should be apparent that the overall AGC response is determined by adjusting the step size and update rate parameters for a family of thresholds. Different AGC responses can be generated by utilizing different families of thresholds having different step sizes and update rates. Each AGC response corresponding to a given family of thresholds may be tailored to a specific protocol and modulation requirement.

It should be emphasized that for every decision step between steps 90 and 56 and for every decision step between steps 104 and 70 as noted by the dotted lines in FIG. 4, there is a paired structure where each decision step has a companion "No" resultant step (e.g. decision step 90, companion resultant step 92) that determines a corresponding AGC step size and update rate for that threshold decision. Any number of paired decisions and resultant steps can be inserted depending upon the desired resolution of the overall AGC response.

Figure 5:
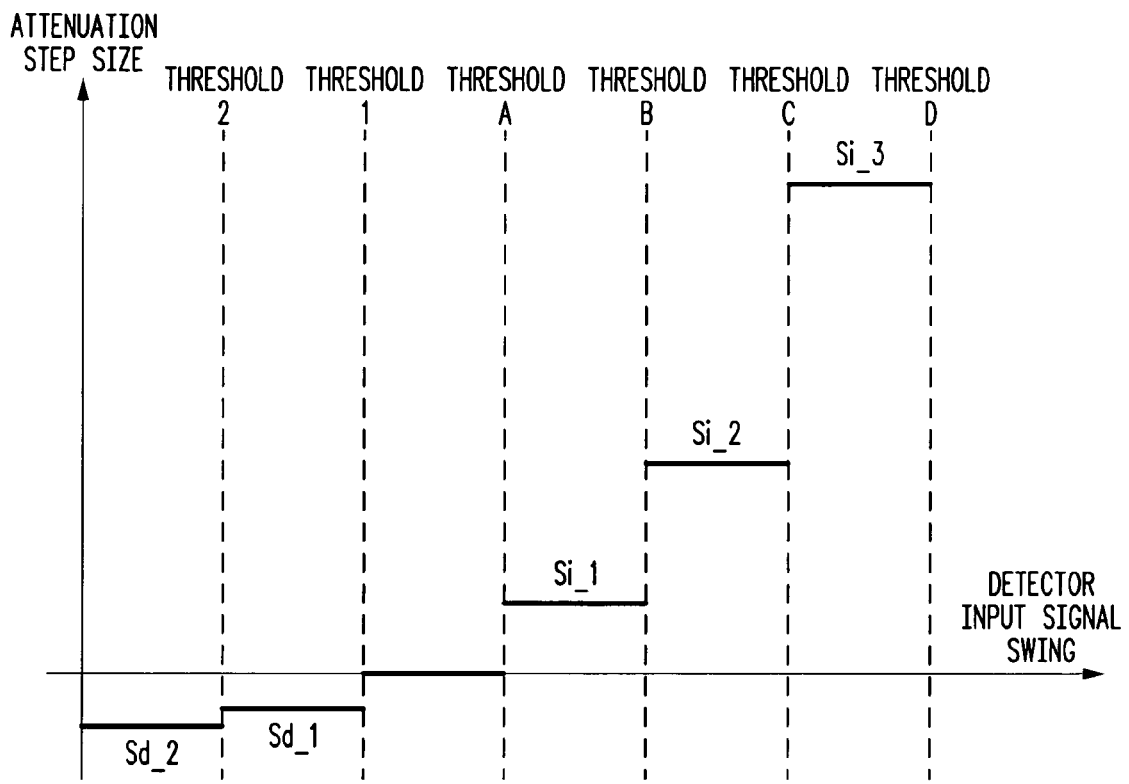
FIG. 5 illustrates in graphical form the relationship of multiple thresholds relative to input signal level and associated changes of AGC state parameters that determine attenuation step sizes.
Figure 6:
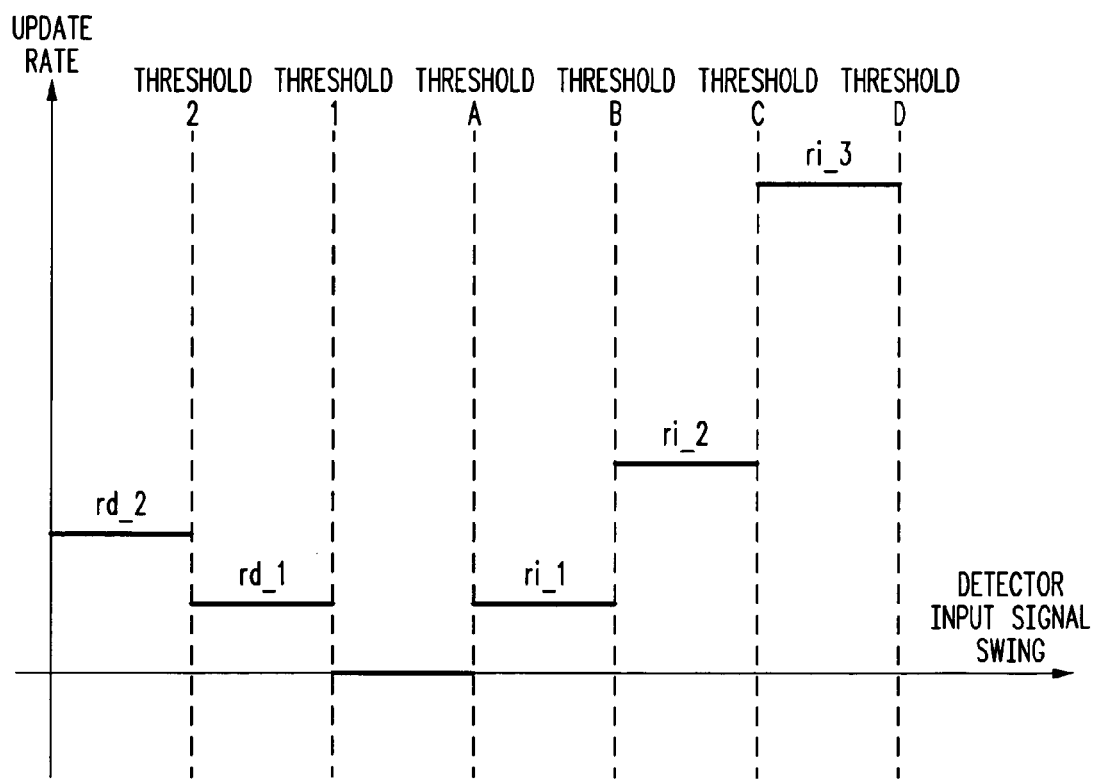
FIG. 6 illustrates in graphical form the relationship of multiple thresholds relative to input signal level and associated changes of AGC state parameters that determine attenuation update rates.

Illustrated in FIGS. 5 and 6 are graphical representations of multiple thresholds defining boundaries wherein step size and update rates are respectively determined. In FIG. 5, the values of $Sd\_1$ and $Sd\_2$ correspond respectively to steps 58 and 60 of FIG. 3 and determine decrement attenuation step size relative to the detected input signal swing. In FIG. 6, the values of $rd\_1$ and $rd\_2$ correspond respectively to steps 58 and 60 of FIG. 3 and determine the update rate relative to the detected input signal swing. It should be further noted that step size $Sd\_2$ is larger than step size $Sd\_1$ and update rate $rd\_2$ is faster than update rate $rd\_1$ resulting in a fast AGC attack for initial increases in gain. The region defined between Threshold A and Threshold 1 is a steady state condition determined by step 64 of FIG. 3. Step size $Si\_1$ and $Si\_2$ correspond to steps 72 and 74, respectively, of FIG. 3 and determines increment attenuation step size relative to the detected input signal swing. In FIG. 6, the values of $ri\_1$ and $ri\_2$ correspond respectively to steps 72 and 74 of FIG. 3 and determine the update rate relative to the detected input signal swing when incrementing the attenuation. It should be noted that Si_3 and ri_3 are for illustrative purposes only and would require additional decision steps to implement as described above in connection with FIG. 4. Note also that Si_2 and ri_2 are respectively greater than Si_1 and ri_1 resulting in a fast attenuation response as the input signal swing approaches compression. In addition, Si_2 and ri_2 utilized in increasing attenuation are significantly larger than Sd_2 and rd_2 utilized in decreasing attenuation. This affords protection against compression while simultaneously providing for a slower AGC response that will not track out the AM component of the modulated information. In addition, it should be apparent that the regions defined by the family of thresholds do not have to be equally spaced as illustrated in FIGS. 5 and 6 but are determined by a designer for specific modulation and protocols. The illustrated decrement and increment step sizes of FIG. 5 allow fast initial increment of attenuation improving attach times for very weak signal conditions while still providing a slow overdamped response close to the desired attenuation level as required by linear modulation.

Figure 7:
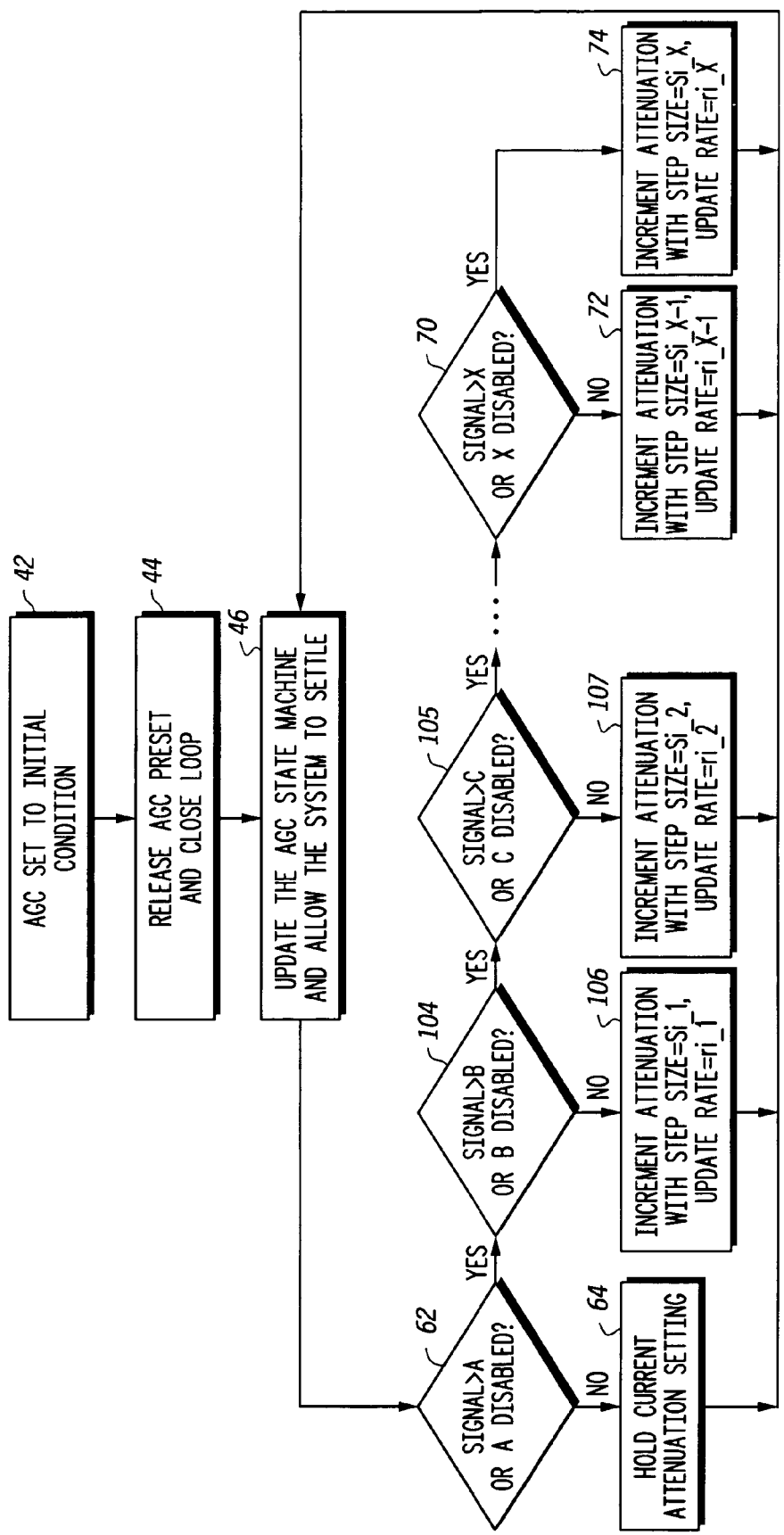
FIG. 7 illustrates in flow chart form a simplified method of automatic gain control where mono-directional gain adjustment is implemented.

Illustrated in FIG. 7 is a flowchart of the automatic gain control method illustrated in FIG. 4 where tracking enable step 48 is set to "No". Generally, this results in a "peak detect" AGC response where the attenuation is set to the maximum detected input signal level. This method is utilized specifically where extremely fast initial AGC attack times are required in order to synchronize quickly to received signals where the timing of said signals is unknown (e.g. TETRA DMO mode). Once the received signal has been acquired, the tracking enable 48 in FIG. 4 can be set to "Yes" resulting in a bidirectional AGC response. The cascaded method illustrated in FIG. 7 and the operation therein is similar in form and function to previously described methodologies of FIGS. 3 and 4 for each paired decision step and associated resultant step between steps 104 and 70. The FIG. 7 flowchart may also represent an AGC methodology wherein only a single direction of AGC control is implemented and no tracking enable step 48 is implemented. In this form, there is no bidirectional response capability.

Figure 8:
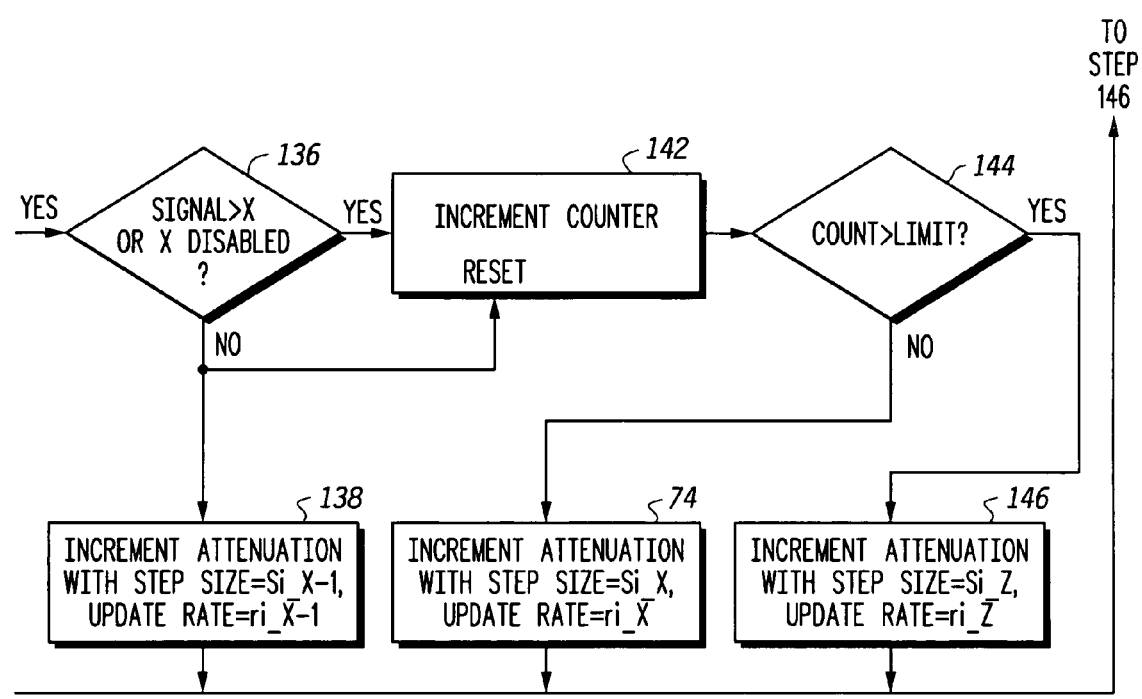
FIG. 8 illustrates in flow chart form a method to further enhance AGC performance for a specific time limit within contiguous threshold boundaries in accordance with the present invention.

Illustrated in FIG. 8 is an extension to the AGC methodology described in FIGS. 3 and 4 following steps 56 and 70. While step 70 (attenuation increment) is expressly described herein, it should be appreciated that the method used in FIG. 8 is equally applicable to step 56 (attenuation decrement) of FIGS. 3 and 4. Assume that the received signal is greater than the X threshold or that the X threshold is disabled. Therefore, a step 142 is performed wherein a counter is incremented to track how many iterations through the decision step 70 have taken place. The counter index is compared to a predefined limit known as a preamble in a step 144. As long as the number of iterations as indicated by the counter index is less than the specified limit, a standard step size and update rate as specified in step 74 is utilized. If however, the counter index exceeds the specified limit, it is known that the AGC latency is large and significant changes to the AGC response must be adopted. This is implemented by performing a step 146 upon a "Yes" condition in step 144, wherein the step size and update rate are significantly increased thereby maximally accelerating the AGC response.

By now it should be appreciated that there has been provided a receiver that provides a common platform from which to operate in multiple protocols wherein different modulation strategies are adopted and evenly scaled on a real-time basis. The AGC structure taught herein and the associated methodology can be easily adapted to any present and future modulation strategies and protocol implementations. There has been provided a generic, flexible method of adapting AGC circuitry to multiple modulation techniques and protocols while being host processor independent. The AGC loop control is based on preprogrammed settings such as multiple state thresholds, DAC step size, update rate and which state, if any, is disabled. By adjusting the update rate and/or step sizes stored in the modulation protocol and parameter registers 29, the receive delays may be varied to implement various modulation protocols. The method disclosed herein is directly transferable for use in any of numerous hardware implementations. No fundamental change of the gain control loop dynamics is required as signal or protocol requirements are changed. To implement various protocols, the threshold values are changed between states as well as the digital-to-analog converter 30 step size and update rates. Each threshold value generates a unique response or signal gain. A plurality of contiguous states or ranges within the digital state machine 26 allow AGC control wherein each state has an independently settable gain update rate and associated gain step size. Asymmetric AGC responses can also be achieved by selectively disabling or enabling a particular AGC state. The AGC responses that can be implemented include "ramp up" and hold and "ramp down" and hold responses. Within a given state of the state machine 26, a preamble sequence may be set to allow response of the state to initiate a predetermined number of iterations at a different update rate or different step size prior to reverting to a predetermined normal operating parameter.

Although the method and structure taught herein has been disclosed with respect to certain specific steps and circuitry, it should be readily apparent that various alternatives may be used. For example, the clock division function provided by clock divider 32 may be shared between clock divider 32 and a clock divider (not shown) within the automatic gain control state machine controller 28 wherein clock divider 32 performs an initial coarse divide to operate some circuitry within state machine 26 at a higher clock speed than the actual gain update speed. The number of automatic gain control states is a matter of design choice and is limited by the number of bits of the output of the on-channel signal detector 22 and the off-channel signal detector 24. For example, if the outputs of the detectors are three-bit outputs, up to eight automatic gain control states may be implemented. Any type of A/D converter and D/A converter may be used including sigma delta converter, resistive ladder converters, capacitive converters, etc. Multiple host processors may interface with the AGC circuitry through one or more respective serial peripheral interfaces. The values of step increments and decrements and update rates are exemplary and are chosen for purposes of explanation. The connection between the receiver and the host processor may be a wireless connection. Although the received signal is discussed herein as an RF signal, the method taught herein is applicable to other frequency ranges.

In the embodiments discussed herein there has been provided an apparatus for receiving and processing a modulated signal. The apparatus has an interface for interfacing with a host processor. An automatic gain control state machine is coupled to the interface for receiving control information indicative of a modulation protocol. The automatic gain control state machine is selectably configurable for automatic gain control in accordance with any one of a plurality of modulation protocols. A storage location is coupled to the interface for receiving and storing the control information and is coupled to provide the control information to the automatic gain control state machine. At least one signal detector is coupled to detect and provide an indication of a signal strength of the modulated signal to the automatic gain control state machine. The automatic gain control state machine is configured to operate in each of a plurality of selectable states, each state being selected depending on a detected signal strength of the modulated signal. An intermediate frequency generation circuit includes at least one of a mixer and a filter. The at least one signal detector has an off-channel signal detector that is coupled to receive a radio frequency modulated signal on an input side of the intermediate frequency generation circuit to provide a digital indication of signal strength of the radio frequency modulated signal to the automatic gain control state machine. An on-channel signal detector receives an intermediate frequency modulated signal on an output side of the intermediate frequency generation circuit and is coupled to provide a digital indication of signal strength of the intermediate frequency modulated signal to the automatic gain control state machine. A storage location is coupled to the interface for receiving and storing the control information and coupled to provide the control information to the automatic gain control state machine. An attenuation circuit is coupled to receive at least one attenuation control signal from the automatic gain control state machine. The automatic gain control state machine provides the at least one attenuation control signal depending on the control information stored in the storage location and the signal strengths of the modulated signals. The attenuation circuit has a variable gain amplifier and perhaps even a step attenuator. An antenna is coupled to provide the radio frequency signal to the attenuation circuit. A variable gain amplifier is coupled to receive an input radio frequency signal and provides an amplified radio frequency signal. A DAC is coupled to receive a digital control signal from the automatic gain control state machine and to provide an analog control signal to the variable gain amplifier depending on the control information and the signal strengths of the modulated signals. The interface is a serial peripheral interface and the apparatus further has a host processor, the host processor being coupled to the serial peripheral interface to provide the control information indicative of the modulation protocol to be used by the apparatus for communication with other apparatus using the modulation protocol. The approach of the plurality of selectable states includes at least one of the group of characteristics consisting of automatic gain control action, update rate, step size and an adapt initiation holdoff time. Each of the plurality of selectable states is defined by selectable signal strength threshold values. A number of the plurality of selectable states is programmable via the interface. A task specific AGC control circuit is coupled to receive at least one indication of a signal characteristic and coupled to provide an AGC control signal for controlling gain of an AGC loop, wherein the AGC control circuit is configured to control the gain of the AGC loop in accordance with a plurality of states. Each state corresponds to a selectable range of the signal characteristic and to at least one programmable threshold defining at least one such range. At least one gain control stage is coupled to the task specific AGC control circuit. The at least one gain control stage controls gain of a signal depending on the AGC control signal. The at least one programmable threshold is selected based upon which one of a plurality of modulation protocols is selected. The at least one signal characteristic includes a peak-to-average signal swing indication and a signal strength indication of a received signal. An AGC loop is formed by the at least one gain control stage and has at least one of the group consisting of a step attenuator and a low noise amplifier, a task specific AGC control circuit, and a detector stage providing at least one of the indications (e.g., the signal strength indication) of the signal characteristics. The indication is at least one of a D.C. voltage or a digital value proportional to the received signal. In one form, the receiver has an interface for interfacing with a host processor; a task specific processor for automatic gain control, the task specific processor being coupled to receive information from the host processor for determining automatic gain control parameters, the task specific processor being configured to operate independently of the host processor. Information from the host processor includes at least one of the group consisting of signal range information, signal strength threshold information, automatic gain control update rate information, and automatic gain control step size information. The task specific processor is configured to operate according to a gain control function which is continuous within each of a plurality of signal strength ranges and which is nondifferential at each threshold at an edge of each range. An automatic gain control method includes initializing an automatic gain control state machine to a set of preset conditions detecting a signal characteristic of a signal to provide a detected signal characteristic, and controlling gain of the signal by a gain stage using the detected signal characteristic, wherein the gain is controlled over a plurality of ranges of the signal characteristic according to a gain control function which is continuous within each of the plurality of ranges and nondifferential at an edge of each of the plurality of ranges. The signal characteristic is signal strength. The method further includes comparing the signal strength to a threshold value, the threshold value defining an end point of a range of signal strength; controlling gain according to a first signal transfer function if the signal is less than the threshold value; and controlling gain according to a second signal transfer function if the signal is greater than the threshold value. A determination is made whether the threshold value is enabled prior to any comparing of the signal strength to the threshold value. The comparing of the signal strength to the threshold value is performed only if the threshold value is enabled. The signal characteristic is signal strength. The method further includes comparing the signal strength to a threshold value, the threshold value defining an end point of a range of signal strength selecting a first attenuation step size if the signal is less than the threshold value, and selecting a second attenuation step size if the signal is greater than the threshold value. Gain is controlled using at least one of the first attenuation step size and the second attenuation step size. The signal strength is to be controlled towards a programmable target operating range and away from a plurality of operating ranges outside the target operating range, and an attenuation step size for an operating range outside the target operating range depends at least in part on the magnitude of the difference of a threshold of the operating range outside the target operating range and a threshold of the target operating range. A determination is made to indicate how much time that the automatic gain control state machine has been in a particular state and an adapt step size is selected if the time exceeds an adapt holdoff value. The indication of time is a count of a number of cycles or iterations that the automatic gain control state machine has been in the particular state. A first update rate is selected if the signal is less than the threshold value, and a second update rate is selected if the signal is greater than the threshold value. Gain is controlled using one of the first attenuation step size or the second attenuation step size and one of the first update rate or the second update rate. The signal characteristic is signal strength. The signal strength is compared to a threshold value, the threshold value defining an end point of a range of signal strength. A first update rate is selected if the signal is less than the threshold value, and a second update rate is selected if the signal is greater than the threshold value. Gain is controlled using one of the first update rate or the second update rate. A determination is made of an indication of time that the automatic gain control state machine has been in a particular state. An adapt update rate is selected if the time exceeds an adapt holdoff value. A determination is made whether bidirectional gain tracking is enabled and the gain is controlled bidirectionally if tracking is enabled. Gain is controlled unidirectionally if tracking is not enabled. A determination is made if bidirectional gain tracking is enabled and attenuation of the signal strength is increased if bidirectional tracking is not enabled. Attenuation of signal strength is increased and decreased if bidirectional tracking is enabled. Initializing the automatic gain control state machine includes loading state parameters from a storage location to the automatic gain control state machine and setting a digital-to-analog converter to an output value reflective of the state parameters by the automatic gain control state machine. Gain of the signal is controlled by the gain stage under control of the digital-to-analog converter without influence by signal characteristics of the signal being gain controlled. The automatic gain control state machine is released from the set of preset conditions to close an automatic gain control loop. The state parameters include at least one from the group consisting of range edge threshold values, gain action information, step size information, update rate information, and adapt period information. In a receiver having an AGC controller, the receiver adapted to interface with a host processor via an interface, a method includes controlling an AGC loop within the receiver using an AGC state machine implemented within the receiver to affect at least one of attenuation and gain of a signal in a first way if signal strength of the signal is in a first programmable range. The AGC loop is controlled using the AGC state machine to affect at least one of attenuation and gain of the signal in a second way if the signal strength is in a second programmable range.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "couple" is intended to cover direct connections as well as connections made via an intervening coupling element or elements. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. An apparatus for receiving and processing a modulated signal, the apparatus comprising:
    an interface for interfacing with a host processor; and
    an automatic gain control state machine coupled to the interface for receiving control information indicative of a modulation protocol, the automatic gain control state machine receiving a signal strength of a signal, comparing the signal strength to a threshold value that defines an end point of a range of signal strength, and controlling gain of the signal according to either a first signal transfer function if the signal is less than the threshold value or a second signal transfer function if the signal is greater than the threshold value, the automatic gain control state machine controlling gain of the signal over a plurality of ranges of the signal characteristic according to a gain control function which is continuous within each of the plurality of ranges and modified to be non-continuous at an edge of each of the plurality of ranges.

2. The apparatus of claim 1 further comprising:
    a storage location coupled to the interface for receiving and storing the control information and coupled to provide the control information to the automatic gain control state machine.

3. The apparatus of claim 1 further comprising:
    an intermediate frequency generation circuit including at least one of a mixer and a filter;
    an off-channel signal detector coupled to receive a radio frequency modulated signal on an input side of the intermediate frequency generation circuit to provide a digital indication of signal strength of the radio frequency modulated signal to the automatic gain control state machine; and
    an on-channel signal detector coupled to receive an intermediate frequency modulated signal on an output side of the intermediate frequency generation circuit and coupled to provide a digital indication of signal strength of the intermediate frequency modulated signal to the automatic gain control state machine.

4. The apparatus of claim 3 further comprising:
    a storage location coupled to the interface for receiving and storing the control information and coupled to provide the control information to the automatic gain control state machine; and
    an attenuation circuit coupled to receive at least one attenuation control signal from the automatic gain control state machine, the automatic gain control state machine providing the at least one attenuation control signal depending on the control information stored in the storage location and the signal strengths of the modulated signals.

5. The apparatus of claim 4 wherein the attenuation circuit comprises a variable gain amplifier.

6. The apparatus of claim 5 wherein the attenuation circuit comprises a step attenuator.

7. The apparatus of claim 4 further comprising an antenna coupled to provide the radio frequency signal to the attenuation circuit.

8. The apparatus of claim 3 further comprising:
    a variable gain amplifier coupled to receive an input radio frequency signal and to provide an amplified radio frequency signal; and
    a DAC coupled to receive a digital control signal from the automatic gain control state machine and to provide an analog control signal to the variable gain amplifier depending on the control information and the signal strengths of the modulated signals.

9. The apparatus of claim 4 wherein the interface is a serial peripheral interface, the apparatus further comprising the host processor, the host processor being coupled to the serial peripheral interface to provide the control information indicative of the modulation protocol to be used by the apparatus for communication with other apparatus using the modulation protocol.

10. The apparatus of claim 1 wherein the automatic gain control state machine comprises a plurality of selectable states that includes at least one of the group of characteristics consisting of: automatic gain control action, update rate, step size and an adapt initiation holdoff time.

11. The apparatus of claim 1 wherein the automatic gain control state machine comprises a plurality of selectable states that are defined by selectable signal strength threshold values.

12. The apparatus of claim 11 wherein a number of the plurality of selectable states is programmable via the interface.

13. An automatic gain control method comprising:
   initializing an automatic gain control state machine to a set of preset conditions;
   detecting a signal strength of a signal to provide a detected signal characteristic;
   comparing the signal strength to a threshold value, the threshold value defining an end point of a range of signal strength; and
   controlling gain of the signal by a gain stage using the detected signal characteristic, wherein the gain is controlled over a plurality of ranges of the signal characteristic according to a gain control function which is continuous within each of the plurality of ranges and nondifferential at an edge of each of the plurality of ranges, the gain stage controlling gain according to a first signal transfer function if the signal is less than the threshold value and according to a second signal transfer function if the signal is greater than the threshold value.

14. The automatic gain control method of claim 13 further comprising:
   determining if the threshold value is enabled prior to any comparing of the signal strength to the threshold value; wherein
   the step of comparing the signal strength to the threshold value is performed only if the threshold value is enabled.

15. The automatic gain control method of claim 13 wherein the signal characteristic is signal strength, the method further comprising:
   comparing the signal strength to a threshold value, the threshold value defining an end point of a range of signal strength;
   selecting a first update rate if the signal is less than the threshold value; and
   selecting a second update rate if the signal is greater than the threshold value.

16. The automatic gain control method of claim 15 further comprising controlling gain using one of the first update rate or the second update rate.

17. The automatic gain control method of claim 15 further comprising:
   determining an indication of time that the automatic gain control state machine has been in a particular state; and
   selecting an adapt update rate if the time exceeds an adapt holdoff value.

18. The automatic gain control method of claim 13 further comprising:
   determining if bidirectional gain tracking is enabled;
   controlling the gain bidirectionally if tracking is enabled; and
   controlling the gain unidirectionally if tracking is not enabled.

19. The automatic gain control method of claim 13 further comprising:
   determining if bidirectional gain tracking is enabled;
   increasing attenuation of the signal strength if bidirectional tracking is not enabled; and
   increasing and decreasing attenuation of signal strength if bidirectional tracking is enabled.

20. An automatic gain control method comprising:
   initializing an automatic gain control state machine to a set of preset conditions;
   detecting a signal strength of a signal to provide a detected signal characteristic;
   controlling gain of the signal by using the detected signal characteristic, wherein the gain is controlled over a plurality of ranges of the detected signal characteristic according to a gain control function which is continuous within each of the plurality of ranges;
   comparing the signal strength to a threshold value, the threshold value defining an end point of a range of signal strength;
   selecting a first attenuation step size if the signal is less than the threshold value; and
   selecting a second attenuation step size if the signal is greater than the threshold value.

21. The automatic gain control method of claim 20 further comprising controlling gain using at least one of the first attenuation step size and the second attenuation step size.

22. The automatic gain control method of claim 20 wherein the signal strength is to be controlled towards a programmable target operating range and away from a plurality of operating ranges outside the target operating range, and an attenuation step size for an operating range outside the target operating range depends at least in part on the magnitude of the difference of a threshold of the operating range outside the target operating range and a threshold of the target operating range.

23. The automatic gain control method of claim 20 further comprising:
   determining an indication of time that the automatic gain control state machine has been in a particular state;
   selecting an adapt step size if the time exceeds an adapt holdoff value.

24. The automatic gain control method of claim 20 wherein the indication of time is a count of a number of cycles or iterations that the automatic gain control state machine has been in the particular state.

25. The automatic gain control method of claim 20 further comprising:
   selecting a first update rate if the signal is less than the threshold value; and
   selecting a second update rate if the signal is greater than the threshold value.

26. The automatic gain control method of claim 25 further comprising controlling gain using one of the first attenuation step size or the second attenuation step size and one of the first update rate or the second update rate.

27. An automatic gain control method comprising:
   initializing an automatic gain control state machine to a set of preset conditions;
   detecting a signal characteristic of a signal to provide a detected signal characteristic;
   controlling gain of the signal by a gain stage using the detected signal characteristic, wherein the gain is controlled over a plurality of ranges of the signal characteristic according to a gain control function;
   determining if bidirectional gain tracking is enabled;

controlling the gain bidirectionally if tracking is enabled; and controlling the gain unidirectionally if tracking is not enabled.

28. An automatic gain control method comprising:

initializing an automatic gain control state machine to a set of preset conditions;

detecting a signal characteristic of a signal to provide a detected signal characteristic;

controlling gain of the signal by a gain stage using the detected signal characteristic, wherein the gain is controlled over a plurality of ranges of the signal characteristic according to a gain control function;

determining if bidirectional gain tracking is enabled;

increasing attenuation of the signal strength if bidirectional tracking is not enabled; and increasing and decreasing attenuation of signal strength if bidirectional tracking is enabled.

29. The automatic gain control method of claim 28 wherein the gain control function further comprises a gain control function that is continuous within each of the plurality of ranges and which is substantially modified at an edge of the plurality of ranges.

* * * * *